United States Patent
Yamazaki et al.

(10) Patent No.: US 9,590,205 B2
(45) Date of Patent: Mar. 7, 2017

(54) ORGANIC ELECTROLUMINESCENT DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/323,243

(22) Filed: Jul. 3, 2014

(65) Prior Publication Data

US 2014/0312334 A1   Oct. 23, 2014

Related U.S. Application Data

(62) Division of application No. 13/867,471, filed on Apr. 22, 2013, now Pat. No. 8,772,766, which is a division
(Continued)

(30) Foreign Application Priority Data

Sep. 30, 1999   (JP) .................................. 11-279870

(51) Int. Cl.
  *H01L 51/52*   (2006.01)
  *H01L 27/32*   (2006.01)
  *H05B 33/04*   (2006.01)
(52) U.S. Cl.
  CPC ...... *H01L 51/5237* (2013.01); *H01L 27/3244* (2013.01); *H01L 51/524* (2013.01);
(Continued)

(58) Field of Classification Search
  CPC . H01L 27/3244; H01L 51/52; H01L 51/5259; H01L 51/5275
  See application file for complete search history.

(56) References Cited

U.S. PATENT DOCUMENTS

| 4,357,557 A | 11/1982 | Inohara et al. |
| 4,839,707 A | 6/1989 | Shields |

(Continued)

FOREIGN PATENT DOCUMENTS

| EP | 0350907 A | 1/1990 |
| EP | 0809420 A | 11/1997 |

(Continued)

OTHER PUBLICATIONS

European Search Report (Application No. 00121499.8) Dated Dec. 11, 2001.
(Continued)

*Primary Examiner* — Thomas L Dickey
*Assistant Examiner* — Fazli Erdem
(74) *Attorney, Agent, or Firm* — Robinson Intellectual Property Law Office; Eric J. Robinson

(57) ABSTRACT

An organic EL display device of active matrix type wherein insulated-gate field effect transistors formed on a single-crystal semiconductor substrate are overlaid with an organic EL layer; characterized in that the single-crystal semiconductor substrate (413 in FIG. 4) is held in a vacant space (414) which is defined by a bed plate (401) and a cover plate (405) formed of an insulating material, and a packing material (404) for bonding the bed and cover plates; and that the vacant space (414) is filled with an inert gas and a drying agent, whereby the organic EL layer is prevented from oxidizing.

16 Claims, 6 Drawing Sheets

Related U.S. Application Data of application No. 12/949,165, filed on Nov. 18, 2010, now Pat. No. 8,426,876, which is a division of application No. 11/061,614, filed on Feb. 22, 2005, now Pat. No. 7,838,883, which is a division of application No. 09/671,654, filed on Sep. 28, 2000, now Pat. No. 6,876,145.

(52) U.S. Cl.
CPC ...... *H01L 51/5259* (2013.01); *H01L 51/5275* (2013.01); *H05B 33/04* (2013.01); *H01L 51/5281* (2013.01); *H01L 2251/5315* (2013.01)

(56) References Cited

U.S. PATENT DOCUMENTS

| | | | |
|---|---|---|---|
| 4,865,438 A * | 9/1989 | Wada | 351/158 |
| 5,208,690 A | 5/1993 | Hayashi et al. | |
| 5,239,228 A | 8/1993 | Taniguchi et al. | |
| 5,423,119 A | 6/1995 | Yang | |
| 5,463,483 A | 10/1995 | Yamazaki | |
| 5,536,950 A | 7/1996 | Liu et al. | |
| 5,594,569 A | 1/1997 | Konuma et al. | |
| 5,612,565 A | 3/1997 | Kusumoto | |
| 5,677,549 A | 10/1997 | Takayama et al. | |
| 5,694,189 A | 12/1997 | Nakamura et al. | |
| 5,702,963 A | 12/1997 | Vu et al. | |
| 5,733,661 A | 3/1998 | Ue et al. | |
| 5,815,223 A | 9/1998 | Watanabe et al. | |
| 5,856,689 A | 1/1999 | Suzawa | |
| 5,882,761 A | 3/1999 | Kawami et al. | |
| 5,903,098 A | 5/1999 | Jones | |
| 5,904,514 A | 5/1999 | Konuma et al. | |
| 5,909,081 A | 6/1999 | Eida et al. | |
| 5,917,563 A | 6/1999 | Matsushima | |
| 5,929,474 A | 7/1999 | Huang et al. | |
| 5,962,962 A | 10/1999 | Fujita et al. | |
| 5,982,002 A | 11/1999 | Takasu et al. | |
| 5,998,805 A | 12/1999 | Shi et al. | |
| 5,998,841 A | 12/1999 | Suzawa | |
| 6,002,462 A | 12/1999 | Sato et al. | |
| 6,046,547 A | 4/2000 | Nishio et al. | |
| 6,064,076 A | 5/2000 | Chen et al. | |
| 6,075,580 A | 6/2000 | Kouchi | |
| 6,096,582 A | 8/2000 | Inoue et al. | |
| 6,097,543 A | 8/2000 | Rallison et al. | |
| 6,103,558 A | 8/2000 | Yamanaka et al. | |
| 6,114,715 A | 9/2000 | Hamada | |
| 6,127,279 A | 10/2000 | Konuma | |
| 6,147,451 A | 11/2000 | Shibata et al. | |
| 6,157,429 A | 12/2000 | Miyawaki et al. | |
| 6,162,654 A | 12/2000 | Kawabe | |
| 6,166,414 A | 12/2000 | Miyazaki et al. | |
| 6,172,728 B1 | 1/2001 | Hiraishi | |
| 6,175,186 B1 | 1/2001 | Matsuura et al. | |
| 6,204,895 B1 | 3/2001 | Nakamura et al. | |
| 6,208,392 B1 | 3/2001 | Miller et al. | |
| 6,215,244 B1 | 4/2001 | Kuribayashi et al. | |
| 6,271,543 B1 | 8/2001 | Ohtani et al. | |
| 6,274,887 B1 | 8/2001 | Yamazaki et al. | |
| 6,278,131 B1 | 8/2001 | Yamazaki et al. | |
| 6,284,342 B1 | 9/2001 | Ebisawa et al. | |
| 6,307,532 B1 | 10/2001 | Aoki | |
| 6,320,204 B1 | 11/2001 | Hirabayashi et al. | |
| 6,346,718 B1 | 2/2002 | Yamanaka et al. | |
| 6,351,010 B1 | 2/2002 | Yamanaka et al. | |
| 6,362,798 B1 | 3/2002 | Kimura et al. | |
| 6,372,558 B1 | 4/2002 | Yamanaka et al. | |
| 6,380,558 B1 | 4/2002 | Yamazaki et al. | |
| 6,380,687 B1 | 4/2002 | Yamazaki | |
| 6,433,355 B1 | 8/2002 | Riess et al. | |
| 6,445,005 B1 * | 9/2002 | Yamazaki | H01L 27/322 257/59 |
| 6,483,484 B1 * | 11/2002 | Yamazaki et al. | 345/8 |
| 6,518,594 B1 | 2/2003 | Nakajima et al. | |
| 6,518,962 B2 | 2/2003 | Kimura et al. | |
| 6,559,821 B2 | 5/2003 | Ichikawa et al. | |
| 6,573,952 B1 * | 6/2003 | Yamazaki et al. | 349/13 |
| 6,576,924 B1 | 6/2003 | Yamazaki et al. | |
| 6,583,057 B1 | 6/2003 | Alluri et al. | |
| 6,617,644 B1 | 9/2003 | Yamazaki et al. | |
| 6,620,660 B2 | 9/2003 | Ohtani et al. | |
| 6,677,613 B1 * | 1/2004 | Yamazaki | G02F 1/13454 257/40 |
| 6,690,434 B1 * | 2/2004 | Yamazaki et al. | 349/42 |
| 6,724,150 B2 | 4/2004 | Maruyama et al. | |
| 6,759,677 B1 | 7/2004 | Yamazaki et al. | |
| 6,781,155 B1 | 8/2004 | Yamada | |
| 6,819,378 B2 * | 11/2004 | Yamazaki | G02F 1/133553 349/113 |
| 6,826,532 B1 | 11/2004 | Casby et al. | |
| 6,831,623 B2 | 12/2004 | Yasukawa | |
| 6,836,067 B1 | 12/2004 | Imai | |
| 6,977,394 B2 | 12/2005 | Yamazaki et al. | |
| 7,095,082 B2 | 8/2006 | Yamanaka et al. | |
| 7,118,994 B2 | 10/2006 | Yamazaki et al. | |
| 7,161,176 B2 | 1/2007 | Yamazaki et al. | |
| 7,233,342 B1 * | 6/2007 | Yamazaki et al. | 345/692 |
| 7,288,789 B2 | 10/2007 | Yamazaki et al. | |
| 7,678,624 B2 | 3/2010 | Yamazaki et al. | |
| 7,723,725 B2 | 5/2010 | Yamazaki et al. | |
| 8,772,766 B2 * | 7/2014 | Yamazaki | H01L 27/3244 257/350 |
| 2003/0201496 A1 | 10/2003 | Yamazaki et al. | |
| 2004/0036071 A1 | 2/2004 | Yamazaki et al. | |
| 2005/0116882 A1 | 6/2005 | Yamazaki et al. | |

FOREIGN PATENT DOCUMENTS

| | | |
|---|---|---|
| EP | 0859539 A | 8/1998 |
| EP | 0886329 A | 12/1998 |
| JP | 08-222369 A | 8/1996 |
| JP | 08-236274 A | 9/1996 |
| JP | 11-016677 A | 1/1999 |
| JP | 11-040347 A | 2/1999 |
| JP | 11-054268 A | 2/1999 |
| JP | 11-054285 A | 2/1999 |
| JP | 11-121165 A | 4/1999 |
| JP | 11-251600 A | 9/1999 |
| JP | 2000-030871 A | 1/2000 |
| TW | 226488 | 7/1994 |
| WO | WO-95/23425 | 8/1995 |
| WO | WO-97/47050 | 12/1997 |

OTHER PUBLICATIONS

Yoshida.T et al., "33.2: A Full-Color Thresholdless Antiferroelectric LCD Exhibiting Wide Viewing Angle With Fast Response Time", SID Digest '97 : SID International Symposium Digest of Technical Papers, May 1, 1997, vol. 28, pp. 841-844.

Furue.H et al., "P-78: Characteristics and Driving Scheme of Polymer-Stabilized Monostable FLCD Exhibiting Fast Response Time and High Contrast Ratio With Gray-Scale Capability", SID Digest '98 : SID International Symposium Digest of Technical Papers, May 1, 1998, vol. 29, pp. 782-785.

Inui.S et al., "Thresholdless Antiferroelectricity in Liquid Crystals and its Application to Displays", J. Mater. Chem. (Journal of Materials Chemistry), 1996, vol. 6, No. 4, pp. 671-673.

Sato.F et al., "High Resolution and Bright LCD Projector With Reflective LCD Panels", SID Digest '97 : SID International Symposium Digest of Technical Papers, May 13, 1997, vol. 28, pp. 997-1000.

Kurogane.H et al., "Reflective AMLCD for Projection Displays: D-ILA", SID Digest '98 : SID International Symposium Digest of Technical Papers, May 17, 1998, vol. 29, pp. 33-36.

Nagata.T et al., "Silicon-Chip-Based Reflective PDLC Light Valve for Projection Display", SID Digest '98 : SID International Symposium Digest of Technical Papers, May 17, 1998, vol. 29, pp. 37-40.

Dove.D, "High Performance Projection Displays Based on Reflective LC Silicon Light Valves", IDW '98 : Proceedings of the 5th International Display Workshops, Dec. 7, 1998, pp. 741-744.

(56) References Cited

OTHER PUBLICATIONS

Hirota.S et al., "A Silicon-Chip-Based Light Valve With Reflective Twisted Nematic Mode for High-Definition Projectors", IDW '99 : Proceedings of the 6th International Display Workshops, Dec. 1, 1999, pp. 985-988.
Office Action (Application No. 200610084589.3) Dated Mar. 28, 2008.

* cited by examiner

ORGANIC ELECTROLUMINESCENT DISPLAY DEVICE

BACKGROUND OF THE INVENTION

Field of the Invention

The present invention relates to a semiconductor device having a circuit based on insulated-gate field effect transistors in which a single-crystal semiconductor is used for an active layer, and a method of fabricating the semiconductor device. More particularly, the present invention is well suited for applications to an electrooptic device which is typified by an organic electroluminescent display device wherein the same substrate is overlaid with a pixel unit and driver circuits disposed around the pixel unit, and to an electronic apparatus in which the electrooptic device is installed. Incidentally, here in this specification, the expression "semiconductor device" is intended to signify general devices which function by utilizing semiconductor properties, and it shall cover within its category the electrooptic device and the electronic equipment including this electrooptic device.

Description of the Related Art

In the field of flat display devices (flat panel displays) typified by liquid-crystal display devices, organic EL (electroluminescent) display devices, etc., there has been known technology wherein a display device of active matrix type is fabricated by employing insulated-gate field effect transistors (hereinbelow, the "field effect transistors" shall be abbreviated to "FETs") formed on a single-crystal semiconductor substrate. Unlike in a case where a display device of active matrix type is fabricated by forming thin-film transistors (hereinbelow, abbreviated to "TFTs") on a glass substrate or a quartz substrate, the technology has had the advantage that techniques fostered in the field of large-scale integrated circuits (LSIs) are applicable as they are, and that the FETs of high performance which are capable of low-voltage drive at high speed can be integrated and formed at a high density on the substrate. On the other hand, however, it has been considered the disadvantage of the technology that the display device is restricted to one of reflection type or spontaneous luminescence type because the substrate is opaque to visible light, or that the single-crystal semiconductor substrate is restricted to sizes available on the market.

In the technological trends toward higher image quality and full digitization in the field of the display devices, the enhancements of performances required of the active matrix type display device have inevitably heightened. The active matrix type display device is so constructed that transistors (such as TFTs or FETs) in the number of several tens to several millions are arranged in a pixel unit for displaying an image, and that pixel electrodes are respectively connected to the transistors. In operation, the image is displayed in such a way that voltages to be applied to respective pixels are controlled by the switching functions of the corresponding transistors, whereby some of EL elements are caused to luminesce. In the organic EL display device, when the switching transistors disposed in the respective pixels are turned ON, currents are caused to flow through current controlling transistors by signals generated in accordance with image data, whereby the EL elements luminesce spontaneously.

However, an organic EL layer which serves as the basic portion of the organic EL display device is very liable to oxidize, and it easily deteriorates in the presence of a slight amount of oxygen. Besides, it has a low becomes a cause for resistance to heat, and this also is a factor promoting oxidation. The liability to oxidize is the cause of a short lifetime of the organic EL element, and has formed a serious obstacle in putting this element into practical use.

SUMMARY OF THE INVENTION

The object of the present invention is to overcome the problem as stated above, and to provide an organic EL display device of high reliability.

Another object of the present invention is to provide an electron device whose display unit is highly reliable, by adopting such an organic EL display device for the display unit.

The construction of the present invention for accomplishing the objects consists in an organic EL display device of active matrix type wherein insulated-gate field effect transistors formed on a single-crystal semiconductor substrate are overlaid with an organic EL layer; characterized in that the single-crystal semiconductor substrate is held in a vacant space which is defined by a bed plate and a cover plate formed of an insulating material and a packing material for bonding the bed and cover plates; and that the vacant space is filled with an inert gas and a drying agent.

Also, the construction of the present invention consists in an organic EL display device of active matrix type having a pixel unit wherein insulated-gate field effect transistors formed on a single-crystal semiconductor substrate are overlaid with an organic EL layer; characterized in that the single-crystal semiconductor substrate is held in a vacant space which is defined by a bed plate and a cover plate formed of an insulating material, and a packing material for bonding the bed and cover plates; that the cover plate is formed of a transparent member in its area which lies over the pixel unit; and that the vacant space is filled with an inert gas and a drying agent.

A single-crystal silicon substrate can be favorably employed as the single-crystal semiconductor substrate. Besides, the vacant space should preferably be filled with an inert gas selected from the group consisting of helium, argon, krypton, xenon and nitrogen, and a drying agent selected from the group consisting of barium oxide and silica gel.

PREFERRED EMBODIMENTS OF THE INVENTION

Figure 1:
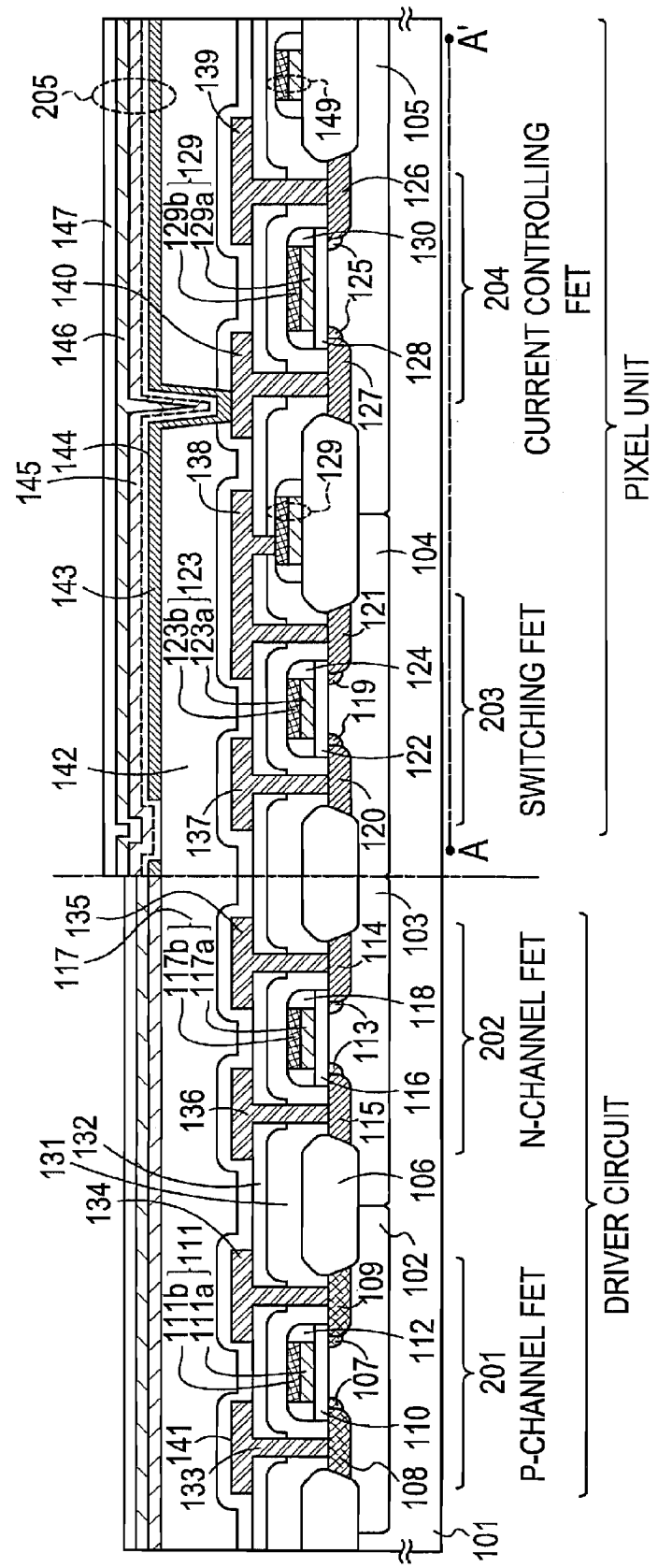
FIG. 1 is a sectional view of an organic EL display device of active matrix type.

First, an organic EL display device according to the present invention will be described with reference to FIG. 1. The organic EL display device according to the present invention has such a structure that a pixel unit and driver circuits around the pixel unit are disposed using field effect transistors (FETs) of insulated gate type which are formed on a single-crystal semiconductor substrate (for example, single-crystal silicon substrate).

A substrate 101 is made of single-crystal silicon having a comparatively high resistance (for example, one of n-type at about 10 [Ωcm]), and a p-well 102 and n-wells 103~105 are formed in self-alignment therein. Adjacent FETs are isolated by a field oxide film 106. In forming the field oxide film 106, channel stoppers may be formed by introducing boron (B) into the selected parts of the substrate 101 in accordance with ion implantation.

Gate insulating films 110, 116, 122 and 128 are formed by thermal oxidation. Gates 111, 117, 123 and 129 consist of polycrystalline silicon layers 111a, 117a, 123a and 129a formed from a polycrystalline silicon film deposited to a thickness of 100~300 [nm] by CVD, and silicide layers 111b, 117b, 123b and 129b formed thereon to a thickness of 50~300 [nm], respectively. The polycrystalline silicon layers may be doped with phosphorus (P) at a concentration of $10^{21}$ [/cm$^3$] or so beforehand in order to lower the resistance thereof, or an n-type impurity at a high concentration may be diffused after the polycrystalline silicon film has been formed. Applicable as the material of the silicide layers is any of molybdenum silicide (MoSi$_x$), tungsten silicide (WSi$_x$), tantalum silicide (TaSi$_x$), titanium silicide (TiSi$_x$), etc., and the silicide layers may well be formed in accordance with a known method.

The lightly-doped drain (LDD) regions 107 of a p-channel FET 201 are doped with boron (B) at a dose of $1\times10^{12}$~$1\times10^{14}$ [/cm$^2$] as an impurity element which bestows the conductivity type of p-type. On the other hand, the LDD regions 113 of an n-channel FET 202, and those 119 and 125 of a switching FET 203 and a current controlling FET 204 made up of n-channel FETs are doped with phosphorus (P) or arsenic (As) as the impurity element which bestows n-type conductivity, at a dose similar to that of p-type. These LDD regions are respectively formed in self-alignment in accordance with ion implantation or ion doping by employing the corresponding gates as masks.

Side wall spacers 112, 118, 124 and 130 are formed in such away that, after the formation of the LDD regions, an insulating film such as silicon oxide film or silicon nitride film is formed on the whole surface of the resulting substrate by CVD, and that the insulating film is uniformly etched over the whole area thereof by anisotropic dry etching, so as to be left behind on the side walls of the corresponding gates. The source regions and drain regions of the respective FETs are formed by employing the corresponding side wall spacers as masks. More specifically, the source region 108 and drain region 109 of the p-channel FET 201 is formed by ion-implanting boron (B) at a dose of $5\times10^{14}$~$1\times10^{16}$ [/cm$^2$]. The n-channel FET 202, and the switching FET 203 and current controlling FET 204 made up of these n-channel FETs are respectively formed with the source regions 114, 120 and 126 and drain regions 115, 121 and 127 by ion-implanting arsenic (As) at a dose of $5\times10^{14}$~$1\times10^{16}$ [/cm$^2$].

A first interlayer insulating film 131 is formed to a thickness of 100~2000 nm out of a silicon oxide film, an oxidized silicon nitride film or the like which should preferably be prepared by plasma CVD or low-pressure CVD. Further, the first interlayer insulating film 131 is overlaid with a second interlayer insulating film 132 which is made of phosphosilicate glass (PSG), borosilicate glass (BSG) or phosphoborosilicate glass (PBSG). The second interlayer insulating film 132 is prepared by spin coating or normal-pressure CVD. The prepared film is caused to reflow by a treatment of thermal activation at 700~900 [° C.], which is carried out after the preparation and which serves also as a heat treatment, whereby the surface of the second interlayer insulating film 132 is flattened.

Source wiring lines 133, 135, 137 and 139 and drain wiring lines 134, 136, 138 and 140 are respectively formed after contact holes reaching the source regions and drain regions of the corresponding FETs are formed in the first interlayer insulating film 131 and the flattened film 132. Aluminum (Al) which is usually and often used as a low-resistance material, may be employed for the wiring lines. Alternatively, a multilayer structure consisting of an Al layer and a titanium (Ti) layer may be employed for each of the wiring lines.

A passivation film 141 is formed of a silicon nitride film, a silicon oxide film or a nitrified silicon oxide film by plasma CVD. Further, a third interlayer insulating film 142 is formed of an organic resin material to a thickness of 1 [μm]~2 [μm]. Any of the following: a polyimide resin, a polyamide resin, an acrylic resin, benzo-cyclo-butene (BCB), etc. can be used as the organic resin material. The merits of the use of the organic resin material are that a method of forming the film is simple, that parasitic capacitance can be lowered owing to a low relative dielectric constant, that the material is suited to be flattened, and so forth. Of course, any organic resin film other than mentioned above may be employed. Here, the polyimide resin of the type which is applied on the resulting substrate and then is treated by thermal polymerization is employed, and it is baked at 300 [° C.] in a clean oven.

A pixel electrode 143 is connected to the drain wiring line of the current controlling FET 204. The pixel electrode 143 is formed of a low-resistivity material typified by Al. An Al film can be readily formed by a known method of forming the film, for example, vacuum deposition or sputtering. In order to improve the contrast , the surface of the pixel electrode 143 may be roughened into a diffusing reflective surface.

After the formation of the pixel electrodes 143, cathode layers 144 containing a metal of low work function are formed on all the pixel electrodes. Since the cathode layer 144 is as thin as a few nm or so, whether a true layer is formed or it exists sporadically in the shape of islands is unclear, and hence, its contour is indicated by a broken line.

A material which is usable as the cathode layer 144 containing the metal of low work function, is lithium fluoride (LiF), lithium oxide (Li$_2$O), barium fluoride (BaF$_2$), barium oxide (BaO), calcium fluoride (CaF$_2$), calcium oxide (CaO), strontium oxide (SrO) or cesium oxide (Cs$_2$O). Since the material is insulating, the short-circuiting between the pixel electrodes is not incurred even when the cathode layer 144 is a connecting layer. Of course , a cathode layer made of a known material having conductivity, such as MgAg electrode, can be used as the cathode layer. It is necessary, however, to form cathodes themselves selectively or to perform patterning, so as to prevent the pixel electrodes from short-circuiting.

An organic EL (electroluminescent) layer 145 is formed on the cathode layer 144 containing the metal of low work function. Although a known material or structure can be employed for the organic EL layer 145, a material capable of white luminescence is used in the present invention. Structurally, the organic EL layer 145 may be formed of nothing but a luminescent layer which offers a site for recombination. If necessary, it is also allowed to stack on this an electron injection layer, an electron transport layer, a hole transport layer, an electron blocking layer, a hole blocking layer or a hole injection layer. Here in this specification, all the layers where carriers are injected, transported or recombined shall be comprehensively called the "organic EL layer".

In addition, the organic EL material used for the organic EL layer 145 is a high-molecular one based on a polymer. For example, the organic EL layer 145 is formed in such a way that PVK (polyvinyl carbazole), Bu-PBD (2-(4'-tert-butylphenyl)-5-(4"-biphenyl)-1,3,4-oxadiazle), coumarin 6, DCM 1 (4-dicyanomethylene-2-methyl-6-p-dimethylaminostyryl-4H-pyran), TPB (tetraphenylbutadiene) and Nile red are dissolved in 1,2-dichloromethane or chloroform, and that a solution thus obtained is applied by spin coating. The substrate structure coated with the solution is rotated at a rotational frequency of about 500~1000 [rpm], for 20~60 [seconds], whereby a uniform coating film is formed.

Of course, the coating film is formed after the organic EL material is refined (typically, by dialyzing) at least 3 times, preferably 5 times or more, thereby to lower the sodium content of this material to 0.1 [ppm] or less (preferably, 0.01 [ppm] or less). Thus, the sodium content of the organic EL layer 349 becomes 0.1 [ppm] or less (preferably, 0.01 [ppm] or less), and the volume resistance thereof becomes $1\times10^{11}$~$1\times10^{12}$ [Ωcm] (preferably $1\times10^{12}$~$1\times10^{13}$ [Ωcm]).

The organic EL layer 145 formed in this way is overlaid with a transparent conductive film as an anode layer 146. Usable for the transparent conductive film is a compound (called "ITO") produced from indium oxide and tin oxide, a compound produced from indium oxide and zinc oxide, tin oxide ($SnO_2$), zinc oxide (ZnO), or the like.

Besides, the anode layer 146 is overlaid with an insulating film as a passivation film 147. The passivation film 147 should preferably be a silicon nitride film or a nitrified silicon oxide film (expressed by "$SiO_xN_y$").

The substrate structure completed up to this point in this specification shall be called "active matrix substrate". That is, the "active matrix substrate" is the substrate which is formed with the FETs, the pixel electrodes electrically connected to the FETs, and organic EL elements including pixel electrodes as the cathodes (capacitors consisting of the cathode layers, the organic EL layer and the anodes).

Figure 2A:
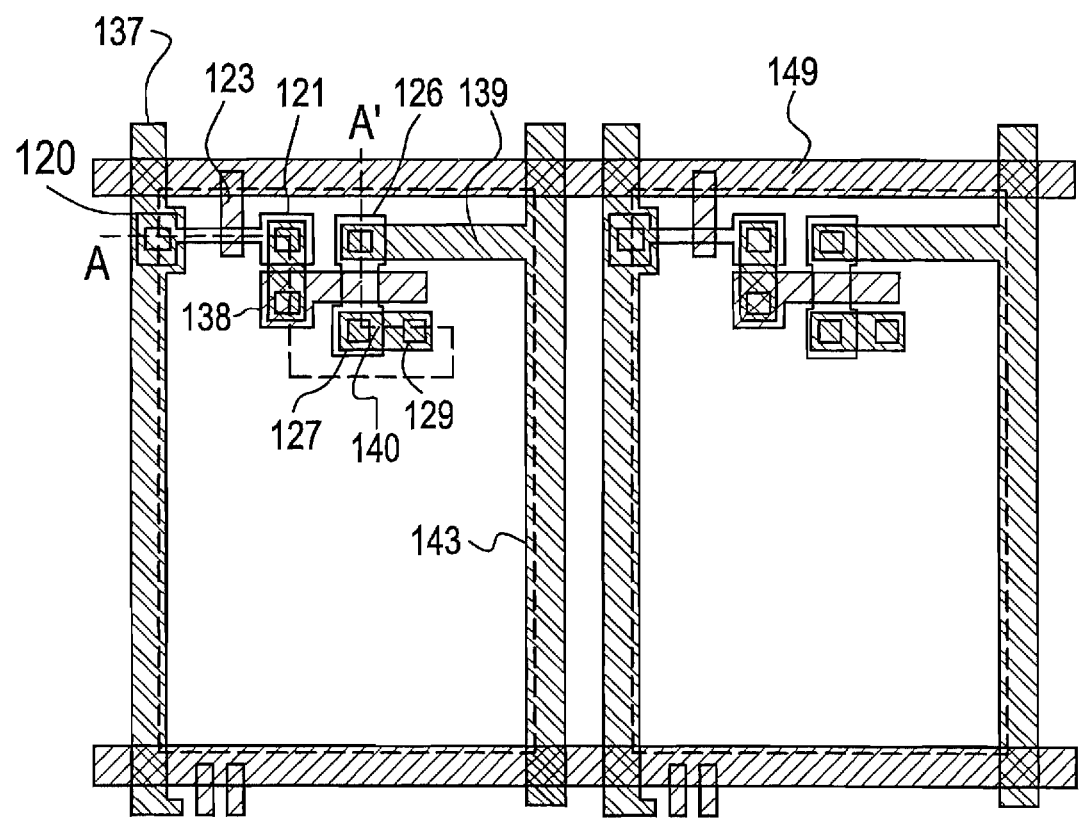
FIGS. 2(A) and 2(B) are diagrams showing the top plan structure and circuit arrangement of a pixel unit in the organic EL display device, respectively.
Figure 2B:
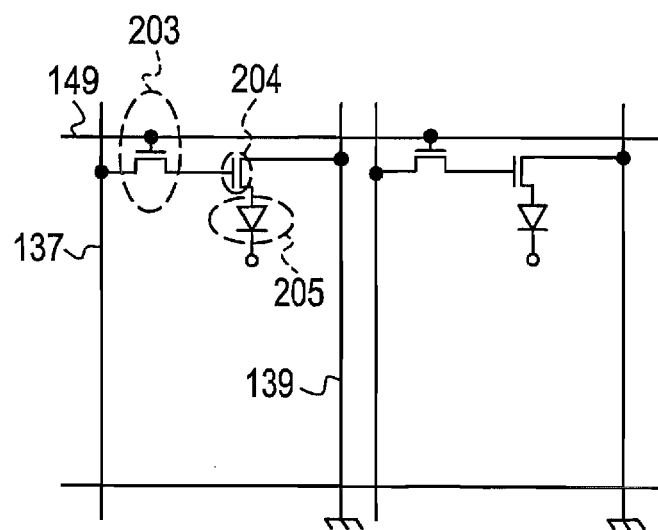

FIG. 2(A) is a top plan view of the pixel unit of the active matrix substrate, while FIG. 2(B) is a connection diagram of the circuit arrangement of the pixel unit. In actuality, the pixel unit (image display unit) is so constructed that a plurality of pixels are arrayed in the shape of a matrix. Incidentally, a sectional view taken along A-A' in FIG. 2(A) corresponds to the sectional view of the pixel unit in FIG. 1. Accordingly, common reference numerals are indicated in FIG. 1 and FIG. 2(A), both of which may be referred to on occasion. Besides, two pixels are illustrated in the top plan view of FIG. 2(A), and they have the same structure. As shown in FIG. 2(B), two FETs per pixel are disposed for the organic EL element 205. Both the FETs are of n-channel type, and they function as the switching FET 203 and the current controlling FET 204.

In the above way, upon the single-crystal silicon substrate can be formed driver circuits each of which is based on a CMOS circuit configured with a p-channel FET 201 and a n-channel FET 202, and pixel units each of which includes switching FET 203 and current controlling FET 204 formed of n-channel FETs. The driver circuits based on the CMOS circuits can form, for example, a shift register circuit, a buffer circuit, a sampling circuit, a D/A converter, and a latch circuit. Since such circuits are constructed of the insulated-gate FETs whose active layers are made of single-crystal silicon, they are capable of high-speed operations, and a lower power consumption can be achieved by setting their drive voltages at 3~5 [V]. By the way, the structures of the FETs explained in this embodiment are nothing more than mere examples, and the FETs need not be restricted to the structures shown in FIG. 1.

Figure 3:
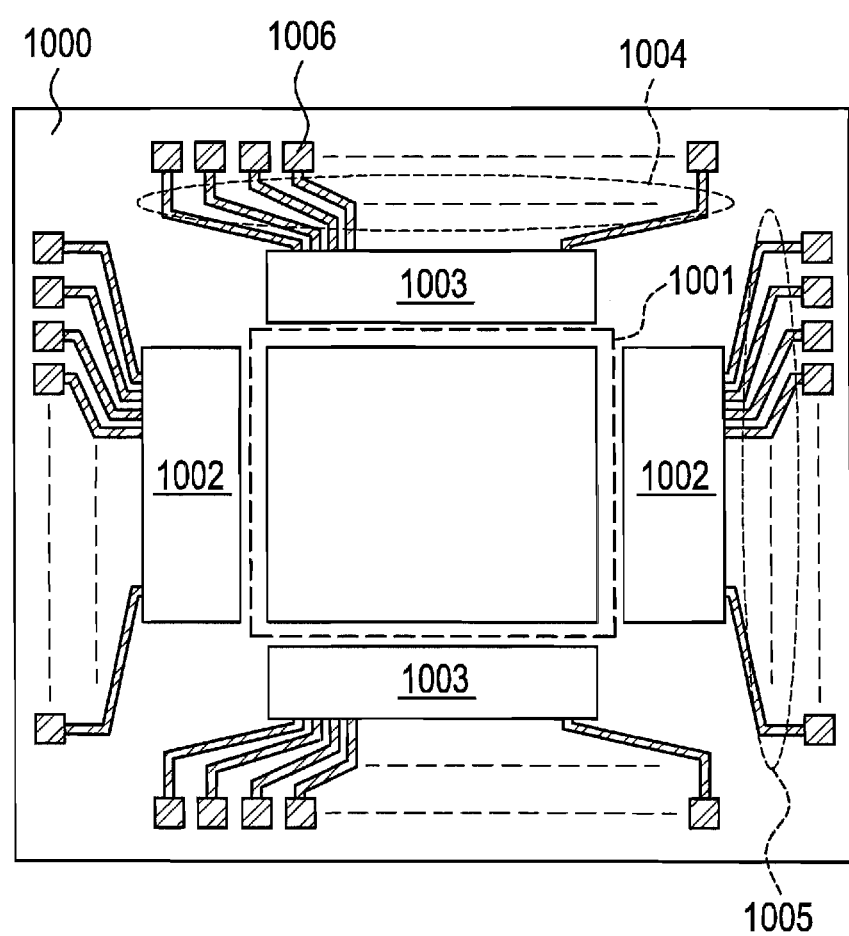
FIG. 3 is a top plan view of the active matrix type organic EL display device.

FIG. 3 is a top plan view showing an active matrix substrate. Referring to the figure, the active matrix substrate includes a substrate 1000, a pixel unit 1001, data line side driver circuits 1003, and scanning line side driver circuits 1002. Input terminals for the respective driver circuits are pads 1006 for wire bonding which are disposed near the edges of the substrate 1000, and they are connected to the driver circuits via leads 1004~1005. The pixel unit having a size of from 0.5-inch class to 2.5-inch class is well suited for fabrication.

The active matrix substrate formed with the organic EL layer is sealed in a package in order to be cut off from external shocks, and ambient conditions such as dust and humidity. The shape and scheme of the package are exemplified in FIG. 4. A bed plate 401 is formed of an insulating material such as ceramics, and the active matrix substrate 413 formed with the organic EL layer is fixed thereon by a low-melting glass or metallized layer 402. The active matrix substrate 413 is connected with an external circuit by a lead frame 404, which is connected with the active matrix substrate 413 by wire pieces 412 of gold (Au) through pads 410 for wire bonding.

The active matrix substrate 413 is sealed with a cover ceramic plate 405. The ceramic cover plate 405 is bonded with the bed plate 401 by a binder layer 404. Pyroceram cement, bismuth oxide-based glass, lead oxide-based glass, or the like is used for the binder layer 404. A window member 406 made of a transparent quartz plate, a transparent glass plate or the like is mounted and fixed with adhesives 407 in an area where the cover plate 405 formed of the ceramics or the like insulating material similarly to the bed plate 401 lies over the pixel unit of the active matrix substrate 413. In this way, the active matrix substrate 413 formed with the organic EL layer is enclosed, and a vacant space 414 is formed. Further, the vacant space 414 should desirably be filled with an inert gas (such as argon, helium, krypton, xenon or nitrogen) or have a drying agent (such as barium oxide) put therein. In this way it is possible to suppress the deterioration of the EL element attributed to moisture etc.

Although not shown in this embodiment, a color display can also be constructed by disposing color filters or black matrix layers (light intercepting layers) on the organic EL layer in correspondence with the individual pixels formed from the organic EL layer of the active matrix substrate. Alternatively, color filters may well be disposed at the window 406 shown in FIG. 4.

Figure 4:
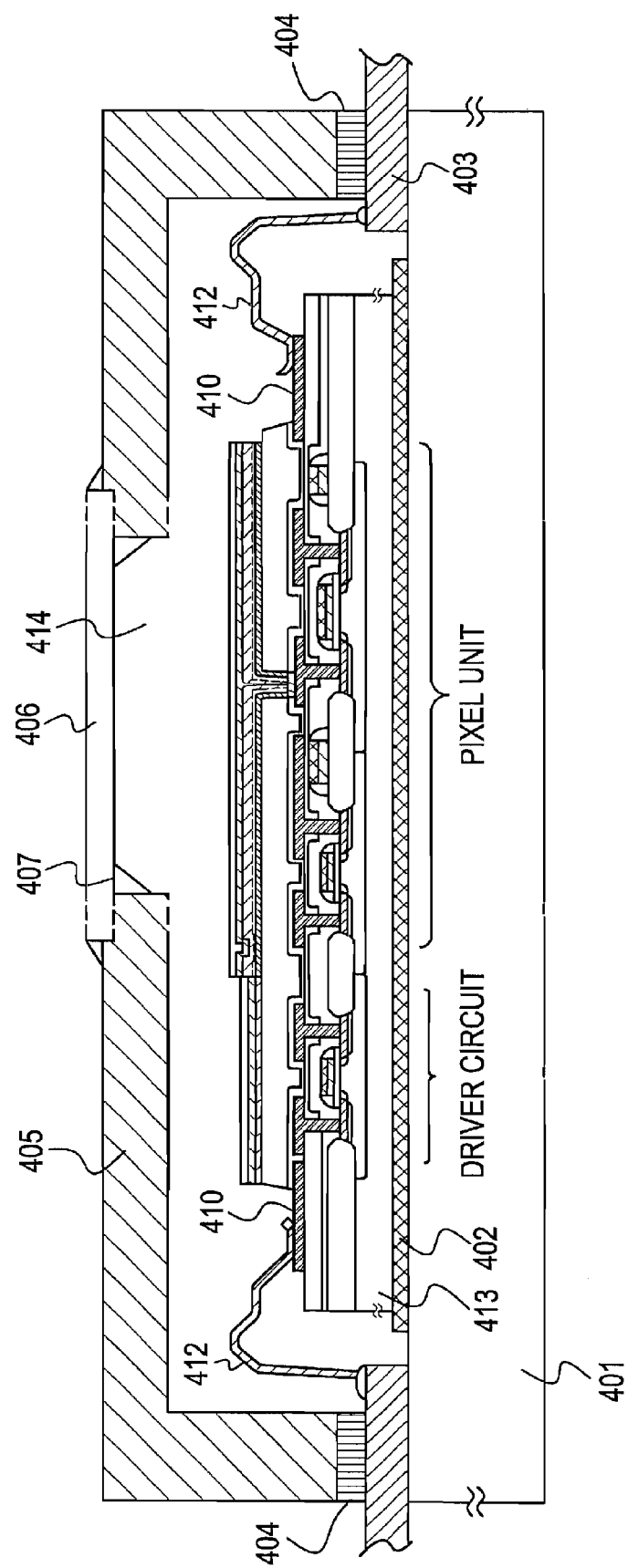
FIG. 4 is a sectional view showing the internal construction of the organic EL display device.

In the state shown in FIG. 4 as described above, the lead frame 403 is connected to the terminals of the external equipment, whereby an image signal etc. can be inputted to display an image on the pixel unit. Here in this specification, an article which is brought into a state where it is capable of displaying an image, by attaching a lead frame to an external circuit, is defined as an "organic EL display device".

Figure 5:
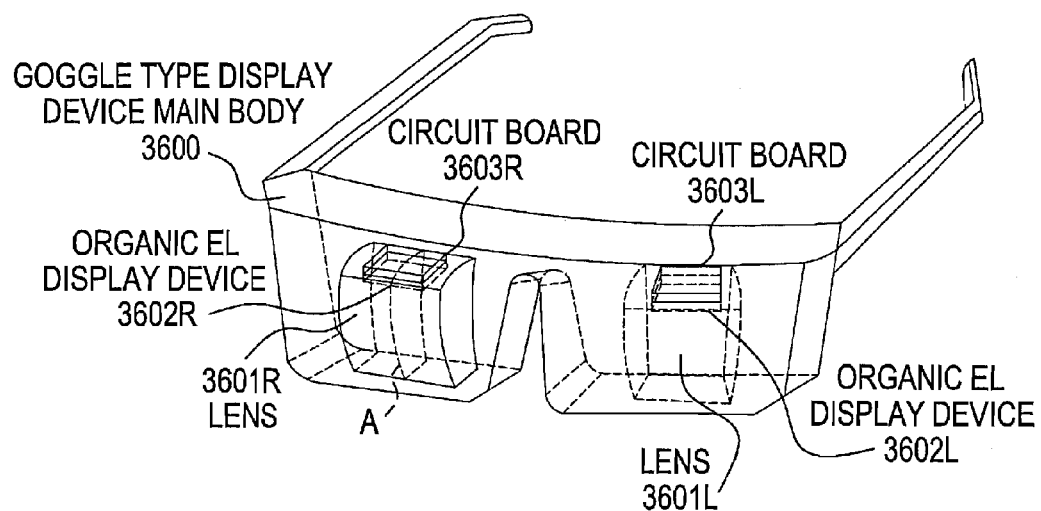
FIG. 5 is a perspective view showing the construction of a goggle type display device in which the organic EL display devices are installed.

Now, there will be described a practicable example in which an organic EL display device of active matrix type is applied to a goggle type display device. FIG. 5 shows a schematic view of the goggle type display device in this example. The goggle type display device main body 3600 is furnished with two, right and left display units, which are constructed of organic EL display devices 3602R, 3602L, circuit boards 3603R, 3603L and lenses 3601R, 3601L.

Figure 6A:
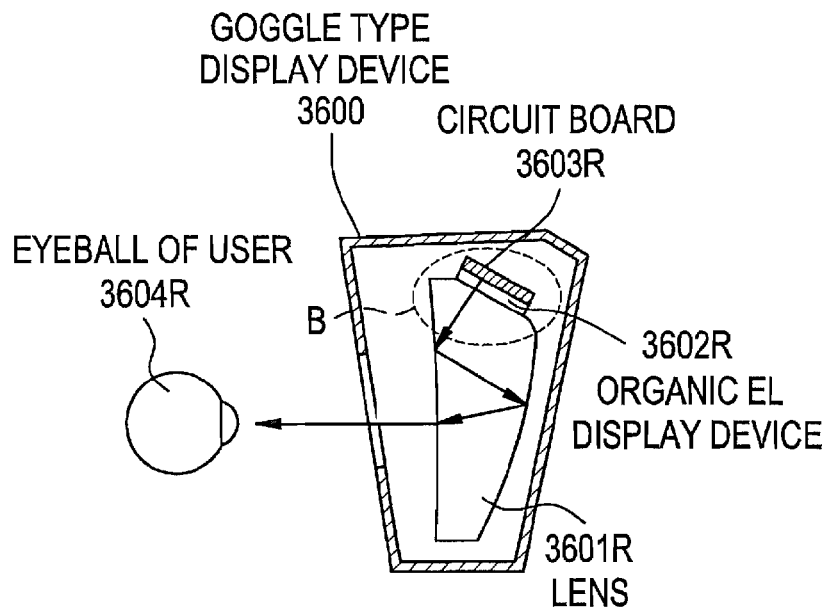
FIGS. 6(A) and 6(B) are sectional views of the goggle type display device in which the organic EL display devices are installed.
Figure 6B:
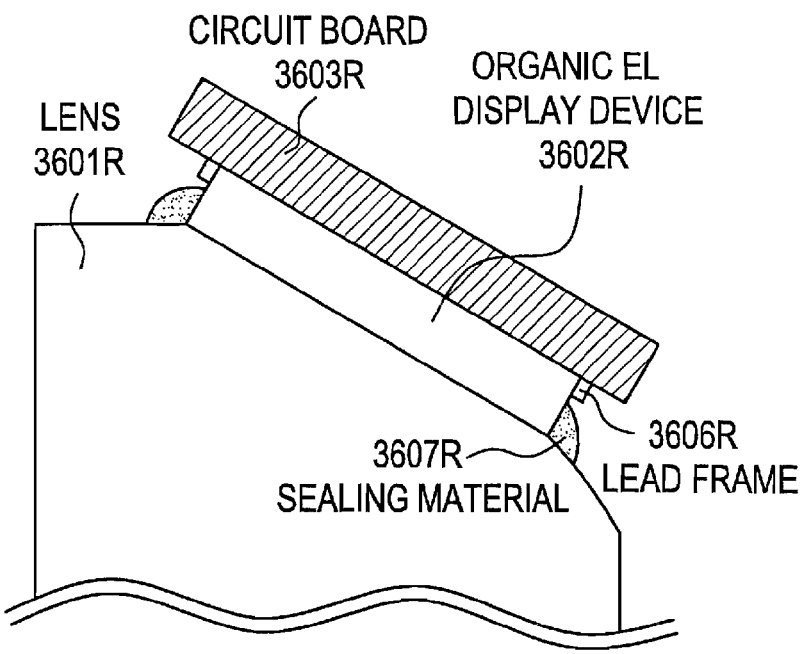

FIG. 6(A) shows a sectional view of part A indicated in FIG. 5, while FIG. 6(B) shows an enlarged view of part B indicated in FIG. 6(A). As shown in FIGS. 6(A) and 6(B), in this example, in the goggle type display device 3600 the organic EL display device 3602R mounted on the lens 3601R is connected to the circuit board 3603R equipped with a signal control circuit etc., through a lead frame 3606R. Light luminescing from the organic EL display device 3602R arrives at the eyeball 3604R of a user via an optical path indicated by arrows in FIG. 6(A), whereby the user can recognize an image.

The organic EL display device has a wide view angle owing to its spontaneous luminescence. When applied to the goggle type display device, the organic EL display is not spoilt even if the relative positions of this display device and an observer's eye have deviated.

The present invention brings forth an effect as stated below:

A single-crystal semiconductor substrate which is formed with insulated-gate field effect transistors and an EL layer, is held in a vacant space which is defined by a bed plate and a cover plate formed of an insulating material, and a packing material for bonding the bed and cover plates, and the vacant space is filled with an inert gas and a drying agent, whereby the oxidation of the EL layer can be prevented to provide an organic EL display device of high reliability.

What is claimed is:

1. A goggle type display device comprising:
a light emitting device including:
a single crystal semiconductor substrate;
first and second insulated gate field effect transistors provided on the single crystal semiconductor substrate;
an EL layer comprising an organic material provided over the first insulated gate field effect transistor;
black matrix layers over the EL layer; and
a first plate and a second plate formed of an insulating material; and
a lens adjacent to the light emitting device,
wherein the EL layer emits a white light,
wherein the single crystal semiconductor substrate is provided in a space which is defined by the first plate and the second plate, and
wherein the space comprises an inert gas and a drying agent.

2. The goggle type display device according to claim 1, wherein the single crystal semiconductor substrate includes n-wells.

3. The goggle type display device according to claim 1, further comprising:
color filters over the EL layer.

4. The goggle type display device according to claim 1, further comprising:
a driver circuit including a third insulated gate field effect transistor provided on the single crystal semiconductor substrate.

5. A goggle type display device comprising:
a first light emitting device including:
a first single crystal semiconductor substrate;
first and second insulated gate field effect transistors provided on the first single crystal semiconductor substrate;
a field oxide film which isolates the first insulated gate field effect transistor from the second insulated gate field effect transistor;
a pixel electrode over the first and the second insulated gate field effect transistors;
an EL layer comprising an organic material provided over the pixel electrode;
black matrix layers over the EL layer;
a source wiring line electrically connected to the first insulated gate field effect transistor;
a passivation film comprising silicon nitride over the EL layer; and
a first plate and a second plate formed of an insulating material; a lens adjacent to the first light emitting device; and
a second light emitting device including a second single crystal semiconductor substrate,
wherein the EL layer emits a white light,
wherein the source wiring line and the field oxide film overlap each other,
wherein the first single crystal semiconductor substrate is provided in a space which is defined by the first plate and the second plate, and
wherein the space comprises an inert gas and a drying agent.

6. The goggle type display device according to claim 5, wherein each of the first single crystal semiconductor substrate and the second single crystal semiconductor substrate includes n-wells.

7. The goggle type display device according to claim 5, further comprising:
color filters over the EL layer.

8. The goggle type display device according to claim 5, wherein the pixel electrode has a diffusing reflective surface.

9. The goggle type display device according to claim 5, further comprising:
a driver circuit including a third insulated gate field effect transistor provided on the first single crystal semiconductor substrate.

10. The goggle type display device according to claim 1, wherein the second plate comprises a window member over the EL layer.

11. The goggle type display device according to claim 5, wherein the second plate comprises a window member over the EL layer.

12. A display device comprising:
a light emitting device comprising:
a single crystal semiconductor substrate;
a pixel portion; and
a cover plate over the single crystal semiconductor substrate and the pixel portion,
wherein the pixel portion comprises a first insulated gate field effect transistor and a second insulated gate field effect transistor and an EL element,
wherein the pixel portion comprises a field oxide film which isolates the first insulated gate field effect transistor from the second insulated gate field effect transistor,
wherein the pixel portion comprises a passivation film comprising silicon nitride over the EL element,
wherein one of a source electrode and a drain electrode of the first insulated gate field effect transistor is electrically connected to a gate electrode of the second insulated gate field effect transistor,
wherein one of a source electrode and a drain electrode of the second insulated gate field effect transistor is electrically connected to an anode of the EL element,
wherein a channel formation region of the first insulated gate field effect transistor is included in the single crystal semiconductor substrate, wherein a channel formation region of the second insulated gate field effect transistor is included in the single crystal semiconductor substrate, wherein the EL element comprises an organic material provided over the first insulated gate field effect transistor and the second insulated gate field effect transistor, wherein the EL element emits white light, and wherein a color filter is provided over the EL element.

13. The display device according to claim 12, further comprising a bed plate, wherein the single crystal semiconductor substrate is held in a space which is defined by the cover plate and the bed plate.

14. The display device according to claim 12, wherein the single crystal semiconductor substrate includes n-wells.

15. The display device according to claim 12, further comprising a driver circuit, wherein the driver circuit includes a third insulated gate field effect transistor, and wherein a channel formation region of the third insulated gate field effect transistor is formed in the single crystal semiconductor substrate.

16. The display device according to claim 12, further comprising a black matrix layer over the EL element.

* * * * *